United States Patent [19]

Rai et al.

[11] 4,004,159
[45] Jan. 18, 1977

[54] ELECTRICALLY REPROGRAMMABLE NONVOLATILE FLOATING GATE SEMI-CONDUCTOR MEMORY DEVICE AND METHOD OF OPERATION

[75] Inventors: Yasuki Rai, Kyoto; Terutoshi Sasami, Osaka; Yuzuru Hasegawa, Osaka; Masaru Okazoe, Osaka, all of Japan

[73] Assignee: Sanyo Electric Co., Ltd., Moriguchi, Japan

[22] Filed: Nov. 3, 1975

[21] Appl. No.: 628,430

Related U.S. Application Data

[63] Continuation-in-part of Ser. No. 469,616, May 13, 1974, abandoned.

[30] Foreign Application Priority Data

May 18, 1973 Japan .......................... 48-56620
Jan. 16, 1974 Japan .......................... 49-7748

[52] U.S. Cl. .......................... 307/238; 357/23; 357/41; 357/54; 357/59
[51] Int. Cl.² .................. H03K 5/00; H01L 29/78; H01L 27/02; H01L 29/34
[58] Field of Search .................... 357/23, 41, 54; 307/238

[56] References Cited
UNITED STATES PATENTS

| | | | |
|---|---|---|---|
| 3,660,819 | 5/1972 | Frohman-Bentchkowsky | 357/23 |
| 3,797,000 | 3/1974 | Agusta et al. | 307/238 |
| 3,825,945 | 7/1974 | Masuoka | 357/23 |
| 3,825,946 | 7/1974 | Frohman-Bentchkowsky | 357/23 |
| 3,836,992 | 9/1974 | Abbas et al. | 357/23 |
| 3,868,187 | 2/1975 | Masuoka | 357/41 |
| 3,893,151 | 7/1975 | Bosselaar et al. | 357/23 |
| 3,919,711 | 11/1975 | Chou | 357/23 |

OTHER PUBLICATIONS

Abbas et al., "Leakage Characterization of Dielectric Materials", IBM Technical Disclosure Bulletin, vol. 16, (July 1973), p. 407.
Lenzlinger et al., "Fowler–Nordheim Tunneling into Thermally Grown SiO₂", J. of Applied Physics, vol. 40, (Jan. 1969), p. 278–283.

*Primary Examiner*—William D. Larkins
*Assistant Examiner*—Gene M. Munson
*Attorney, Agent, or Firm*—Wolfgang G. Fasse; Willard W. Roberts

[57] ABSTRACT

A semiconductor memory device comprising a composite structure of semiconductor-insulation layer-floating gate-insulation layer-control gate, in which a periphery of said floating gate is formed to extend up to and immediately above at least one of source and drain regions, such that both overlap each other through the insulation layer therebetween of silicon dioxide and of a thickness of 200 to 400A for more than 0.35 microns in length but not exceeding two times the distance between the source and drain regions. In erasing the contents written in the inventive memory device, a voltage is applied between the substrate and at least one of the source and drain regions in a reverse bias direction with respect to a junction therebetween, while the control gate is supplied with the same potential as that of the substrate or grounded, said erasing voltage being selected to a relatively small value sufficient to cause a Fowler-Nordheim tunnel phenomenon through the first insulation layer between the floating gate and at least one of the source and drain regions at said overlapping area.

9 Claims, 20 Drawing Figures

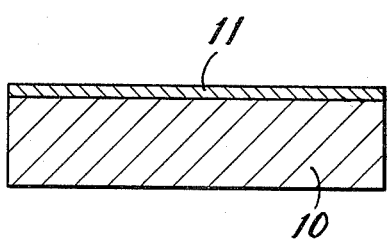
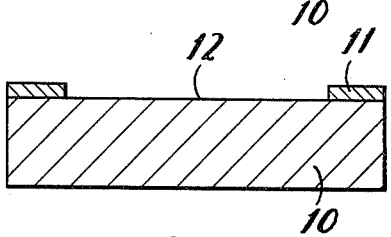
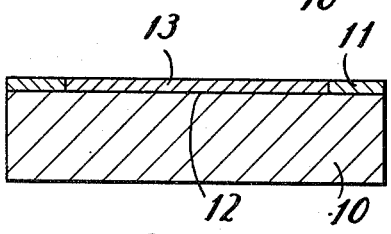
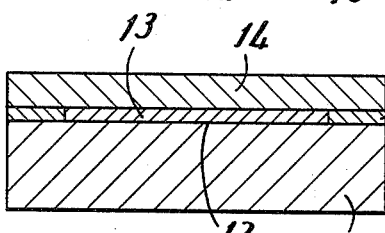
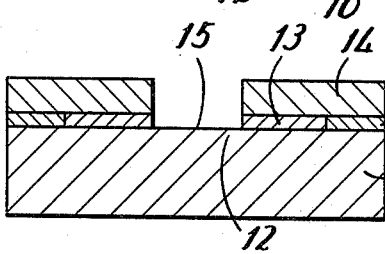
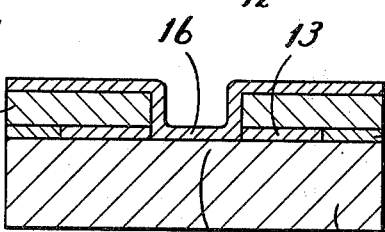
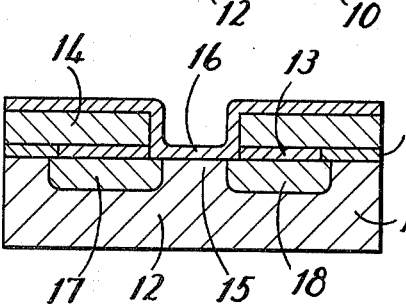
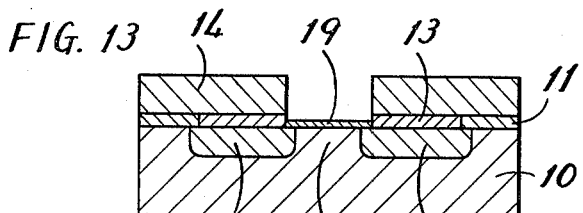
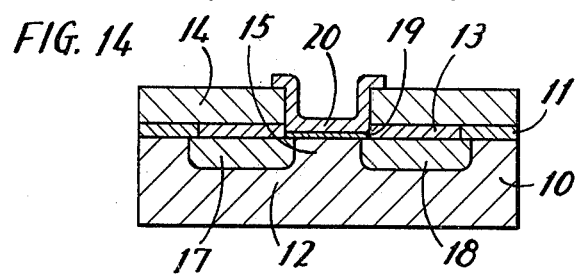
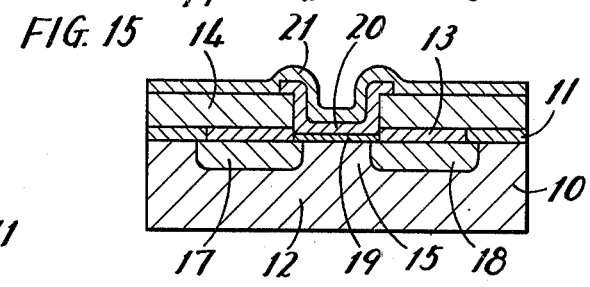
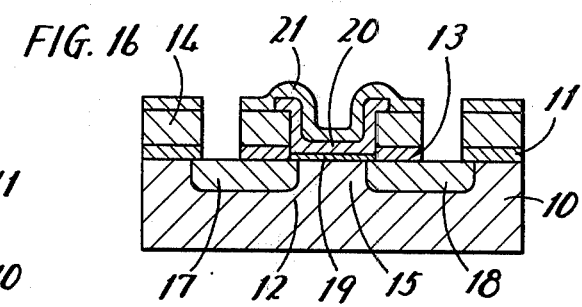
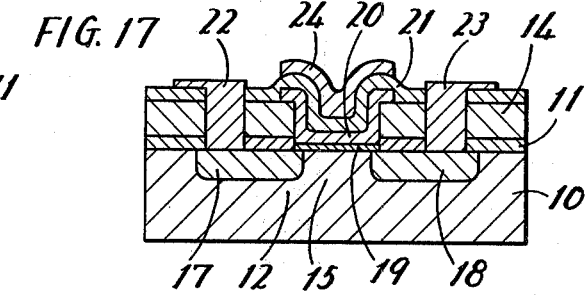
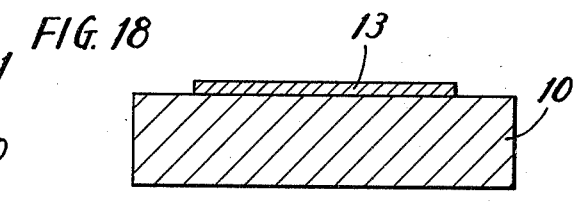

ated May 13, 1974, now abandoned.

ELECTRICALLY REPROGRAMMABLE NONVOLATILE FLOATING GATE SEMI-CONDUCTOR MEMORY DEVICE AND METHOD OF OPERATION

BACKGROUND OF THE INVENTION

The present application is a continuation-in-part of application Ser. No. 469,616 filed May 13, 1974, now abandoned.

FIELD OF THE INVENTION

The present invention relates to a semiconductor memory device. More specifically, the present invention relates to a floating gate type non-volatile semiconductor memory device comprising the structure of a semiconductor-insulation layer-floating gate-insulation layer control gate.

DESCRIPTION OF THE PRIOR ART

A floating gate type non-volatile semiconductor memory device has been proposed already. FIG. 1 is a cross-sectional view of a typical prior art floating gate type non-volatile semiconductor memory device. The device of FIG. 1 comprises a semiconductor substrate 1 of a certain conductivity type such as an N type silicon substrate, a source region 2 and a drain region 3 of, for example, an opposite conductivity type or P type formed in the surface thereof, and a composite layer of metallic and insulating films formed on the substrate 1. More specifically, a first insulation layer 4 of silicon dioxide ($SiO_2$) is formed, extending on a spacing between both regions 2 and 3, and furthermore a floating gate 5 is deposited thereon. As a material constituting the floating gate 5, a semiconductor such as polycrystalline silicon doped in large quantities of impurities such as phosphorous, boron, etc., has been used. The device of FIG. 1 further comprises a second insulation layer 6 of silicon nitride ($Si_3N_4$) deposited on the floating gate 5, a control gate electrode 7 deposited on the silicon nitride layer 6, source and drain electrodes 8 and 9 which are formed respectively in contact with the source and drain regions 2 and 3.

In writing information in memory cells of such structure, typically the following steps have been taken. The substrate is grounded and the gate 7 and at least one of the source and drain regions 2 and 3 are supplied with a voltage of $-40V$. Then the junction between the substrate 1 and said one of the regions 2 and 3 is reverse biased such that avalanche occurs there. Some of the positive holes of high energy are accelerated by the negative voltage applied to the gate electrode 7 and are injected to the floating gate 5 to charge the floating gate 5 to a positive state, thereby rendering the threshold of the device more negative as compared with that as grown.

FIG. 2 is a characteristic curve graph illustrating the changes in characteristics accompanied by such changes in the device of FIG. 1. Referring to FIG. 2, the ordinate shows a drain current, while the abscissa shows a gate voltage. As a result of such changes as described hereinabove, the threshold value voltage $V_T$ of the memory cell changes from a condition with the characteristics of curve A of FIG. 2 to a condition with the characteristics of curve B thereof.

In order to erase the contents which were written in this way, generally one of the following methods have been adopted.

1. The substrate 1 is grounded, and a voltage of $+50V$ is applied to the gate electrode 7, or the gate electrode 7 is grounded, and a voltage of $-50V$ is applied to the substrate 1. The potentials of the source and drain regions 2 and 3 do not matter.

2. The gate electrode 7 is supplied with a high positive voltage and the substrate 1 is grounded and a voltage of $-50V$ or more is applied to both of the source and drain regions 2 and 3.

The method 1 is disadvantageous for the following reasons. As mentioned above, the method (1) utilizes a high positive voltage which is applied to the device for erasing the contents. In a certain type of semiconductor device comprising a floating gate type memory device, the peripheral circuit thereof is formed such that field effect transistors are formed using the same substrate as that of the memory device. In such a semiconductor device, separation should be provided between the memory device and the peripheral circuit for preventing the peripheral circuit from being adversely affected by the positive voltage. On the other hand, according to the method (2), by avalanche-breakdown of the PN junction between the source and drain regions 2 and 3 and the substrate 1, the electrons are injected into the floating gate 5 to erase the written contents. Accordingly, in case the peripheral circuit is formed on the same substrate, as mentioned above, it is necessary that the breakdown voltage of the PN junction of the transistor constituting the peripheral circuit, be higher than that of the memory devices, so that breakdown occurs only at the PN junction between the source and drain regions 2 and 3 and the substrate 1 of the memory device and not at the PN junction of the peripheral circuit, thereby avoiding any adverse affect on the peripheral circuit caused by the erasing, or alternatively, it is necessary that separation similar to the method of (1) is provided, in case an increased positive voltage is applied to the gate electrode to make more efficient the injection of electrons into the floating gate and to lower the breakdown voltage of of the PN junction between the substrate and source or drain region. Another disadvantage of the method (2) is that it is very difficult to control the breakdown voltage of the PN junction of the memory device.

SUMMARY OF THE INVENTION

Briefly stated, the present invention comprises a floating gate type semiconductor device comprising a structure of semiconductor-first insulation layer-floating gate-second insulation layer-control gate, characterized in that the floating gate is formed extending up to immediately above at least one of source and drain regions formed on the semiconductor, whereby an overlapping portion is formed therebetween. The first insulation layer is adapted to be so thick as to avoid a direct tunnel conduction therethrough. In an operation mode of changing the gate voltage versus drain current characteristic of the semiconductor memory device of the present invention from a relatively enhancement type to a relatively depletion type in terms of a field effect device characteristic, a voltage is applied between the substrate and at least one of the source and drain regions in a reverse bias direction with respect to a junction therebetween, while the gate electrode is supplied with the same potential as that of the substrate or grounded. The above mentioned reverse bias voltage is chosen such that the reverse bias per se does not cause breakdown at the junction, but causes a Fowler- Nordheim tunnel phenomenon through said first insulation layer corresponding to the overlapping portion, and the movement of the electrons is caused to effect the erasing operation. Therefore, a lower erasing voltage can be used as compared with the prior art. Thus, in integrating the memory device of the present invention, no special consideration is required as to the withstand voltage of the PN junction of the memory device peripheral circuit. In manufacturing the semiconductor memory device of the present invention, the overlapping area through the insulation layer between the floating gate and at least one of the source and drain regions is realized by lateral diffusion in a diffusion process. Therefore, such an overlapping portion is achieved accurately and easily.

Therefore, it is a principal object of the present invention to bring the characteristics of the semiconductor memory device into a higher depletion type by a relatively low erasing voltage, in case of the floating gate type semiconductor memory comprising a structure of semiconductor-first insulation layer-floating gate-second insulation layer-control gate.

The other objects, features and advantages of the present invention will be more apparent from the detailed description with reference to the drawings.

BRIEF FIGURE DESCRIPTION

In order that the invention will be clearly understood, it will now be described, by way of example, with reference to the accompanying drawings, wherein.

Figure 3:
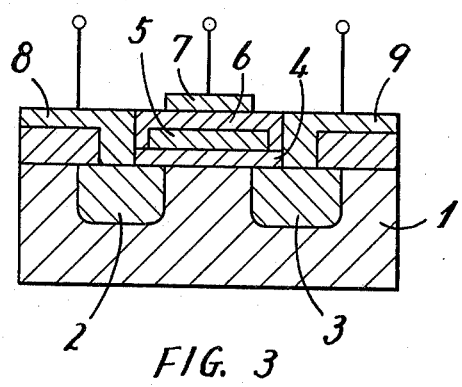
FIG. 3 is a cross sectional view of a memory device of one embodiment of the present invention.

FIGS. 6 to 17 each illustrate a cross sectional structure in several steps of the manufacturing of the semiconductor memory device of a further embodiment of the present invention, which is similar to the memory device of FIG. 3, but is different in sectional configuration of the gate electrodes; and FIG. 18 shows a cross sectional view of the memory device of still another embodiment which is similar to FIG. 9.

DETAILED DESCRIPTION OF PREFERRED EXAMPLE EMBODIMENTS

Figure 1:
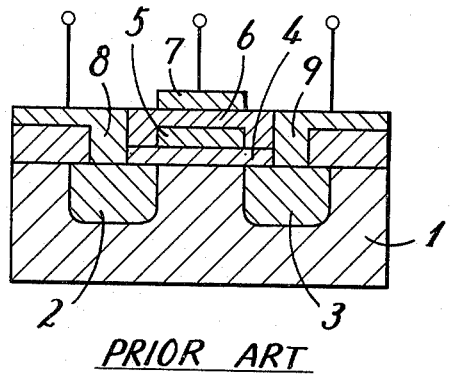
FIG. 1 is a cross sectional view of a conventional semiconductor memory device.
Figure 2:
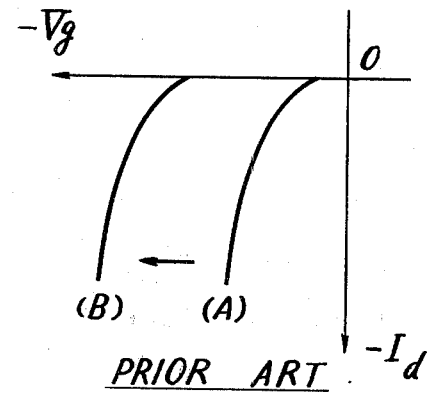
FIG. 2 is a graph showing the writing condition of the memory device of FIG. 1.

FIG. 3 is a cross sectional view of a semiconductor memory device of one embodiment of the present invention. All the reference numerals 1 to 9 as used in FIG. 3 are the same as those of FIG. 1 and the substantial difference between the device of FIG. 3 and the device of FIG. 1 is that both end portions of the floating gate 5 extend up to immediately above the source and drain regions 2 and 3, while the end portions are isolated therefrom by the silicon oxide layer 4. Preferably, the width of the overlapping portion of at least one of the source and drain regions 2 and 3 and the floating gate 5 is selected to be $0.35\mu$ or more, but less than two times the distance between the source and drain regions 2 and 3.

Preferably the thickness of the first insulation layer 4 is selected to be thicker than that of a conductive range in which a direct tunnel effect is dominant and is preferably 200 to 400A if the layer 4 is of silicon dioxide, from the standpoint of a practical voltage to be applied to the device and the stability of the device. The Fowler-Nordheim tunnel conduction is to be distinguished clearly from direct tunnel conduction in that the former occurs such that an electric charge penetrates through an insulation film when the barrier height of the insulation film is so deformed as to provide an energy condition in which a tunnel conduction is possible. More specifically, as the thickness of the oxide film is increased, the voltage across the oxide film is reduced, and the movement of the electric charges becomes more difficult. On the other hand, reductions in the thickness of the oxide film results in a greater probability of pinholes in the oxide film. The pinholes are liable to cause leakage of the electric charges stored in the floating gate through the oxide film. The width of the overlapping portion of at least one of the source and drain regions 2 and 3 and the floating gate 5, and the thickness of the first insulation layer will be discussed in more detail hereinafter. Preferably, a thickness of the second insulation layer 6 is determined in closed relation with that of the first insulation layer 4 in terms of the dielectric constant thereof, and is 600 to 900A, in order to permit the use of a practical range of voltages for writing and erasing, from the standpoint of stability of the device when the above mentioned first insulation layer 4 is employed and the layer 6 is of silicon nitride. The width between the source and drain regions and the doping concentration of the substrate are conventional and may, for example, be $10\mu$ and $10^{15}$ atoms/cm$^3$ respectively.

Theoretically, the thickness of the first insulation layer can be made as thick as desired, as determined in association with the thickness of the second insulation layer 6, but the applied bias voltage must be increased accordingly, as determined by the expression $Vox = E$ critical times film thickness, where E critical is a threshold electric field in which substantial conduction occurs, and $Vox$ is the voltage across the silicon oxide layer at the overlap portion, so that the upper limit of the range of thicknesses of the insulation film 4 should be determined in consideration of the commercially possible voltage for integrated circuits. The lower limit of the thickness of the first insulation film 4 is determined on the basis of the possibility, in fabrication, of pinholes in the layer, as well as in consideration of the time period in which the charge loaded in the floating gate can be maintained stored.

Writing of information in the memory cell of such structure is effected in accordance with the conventional method. A typical conventional method has been discussed above in the section: Description of the Prior Art. The described method of writing is effected by applying a negative voltage of say −40V to the gate 7 and at least one of the source and drain regions 2 and 3 while the substrate 1 is grounded such that the junction between the substrate 1 and one of the regions 2 and 3 is reverse biased and avalanche occurs there, thereby accelerating positive holes to the floating gate 5 to charge it to a positive state. Another method of writing for the purpose of the invention is effected by applying a negative voltage of say −40V to the gate electrode 7 while the source and drain regions 2 and 3 and the substrate 1 are grounded to expel electrons from the floating gate 7, thereby charging the floating gate to a positive state.

A method of erasing the written information in accordance with the present invention will now be described. For the purpose of erasing the information written in the floating gate 5, the gate 7 is grounded and the source and drain regions 2 and 3 are supplied with a negative voltage of say −20V such that the PN junction between the source and drain regions 2 and 3 and the substrate 1 is reverse biased with a voltage less than the inherent avalanche breakdown voltage. Alternatively the gate 7 may be supplied with the same voltage as that of the substrate. As a result electrons are injected from the source and/or drain regions 2 and/or 3 to the floating gate 5 by a Fowler-Nordheim tunnel conduction, which erases the written contents.

Figure 4:
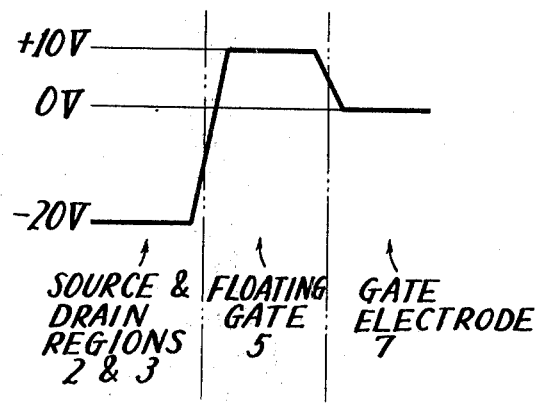
FIG. 4 is a potential distribution graph for illustrating the erasing mechanism of the memory device of the present invention.

FIG. 4 is a graph illustrating the erasing mechanism of the device of FIG. 3. More specifically, upon application of the above mentioned voltage in the above described manner, the potential distributing condition among the gate electrode 7, the floating gate 5, the source and drain regions 2 and 3 is shown in FIG. 4. The gate electrode 7 is grounded and thus is at 0V. On the other hand, the floating gate 5 has been charged into a positive state with the electrons being expelled in the writing mode, showing, for example, approximately +10V potential. The source and drain regions 2 and 3 are at −20V. Furthermore, in accordance with the present invention, the floating gate 5 and the source and drain regions 2 and 3 overlap each other through the silicon oxide layer 4. Therefore, a Fowler-Nordheim tunnel phenomenon is caused at the overlapping area. This phenomenon is discussed, for example, in "Fowler-Nordheim Tunneling Into Thermally Grown $SiO_2$", M. Lenzlinger and E. H. Snow, Journal of Applied Physics, Volume 40, No. 1, January 1969, pages 278 to 283. The electrons are injected from the source and/or drain regions 2 and/or 3 into the floating gate 5 through the silicon oxide layer 4 and the electric charge of the floating gate 5 is neutralized, thereby erasing the written contents.

Fowler-Nordheim tunneling and direct tunneling can be clearly distinguished in terms of a thickness of an insulation layer or an electric field applied through the insulation layer. More specifically, direct tunneling can occur through an insulation layer, only if an electric field applied therethrough exceeds about $10^7$V/cm or a thickness of the insulation layer is less than 20A, while tunneling through an insulation layer of a thickness exceeding 20A is Fowler-Nordheim tunneling.

Now, a more detailed consideration of the width of the overlapping portion of the source and drain regions 2 and 3 and the floating gate 5 in conjunction with the erasing mechanism of the inventive memory cell is believed appropriate. For the purpose of discussion of the overlap width or distance, it is assumed that the first insulation layer 4 is of silicon dioxide and 200A in thickness and the second insulation layer 6 is of silicon nitride and 800A in thickness. Further, it is assumed that the length of the channel underneath the floating gate electrode 5 is $l_1$, while the total overlapping distance by which the floating gate 5 overlaps the source and/or drain regions 2 and 3 is $l_2$. As will be more fully described below, the smaller a ratio of $l_2/l_1$, the better, although there should be an overlap, or the ratio of $l_2/l_1$ should be larger than zero.

Figure 4A:
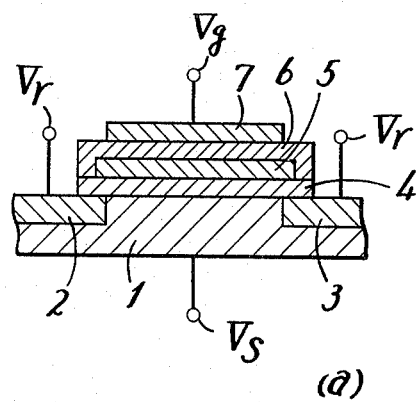
Figure 4A:
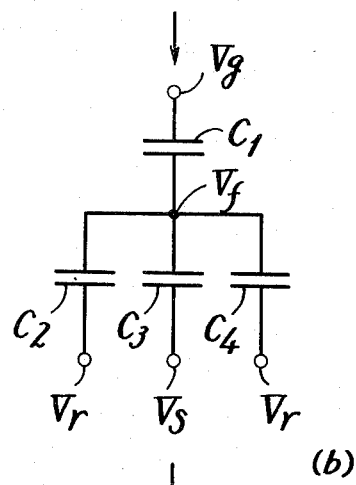
Figure 4A:
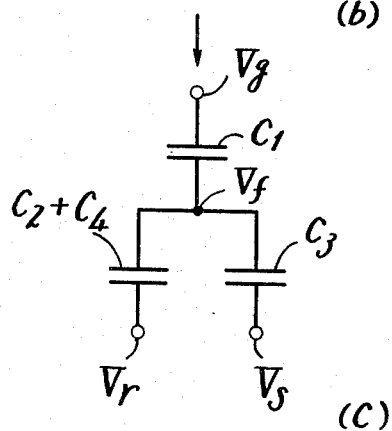

FIG. 4A is a simplified schematic illustration of the device of the invention and equivalent circuits thereof for simplicity of consideration of the overlapping distance. As seen from the FIG. 4A illustration, the inventive device as schematically shown in (a) of FIG. 4A can be shown as in (b) of FIG. 4A by way of an equivalent circuit and the circuit of (b) of FIG. 4A can be further simplified as in (c) of FIG. 4A. In FIG. 4A the same reference numerals are used to designate the same portions and the characters including V have been used to show a voltage at a portion where they are indicated, while the characters including C have been used to show capacitance of an equivalent capacitor where they are indicated.

Assuming that voltages $Vg$, $Vs$ and $Vr$ as indicated in the figure are applied to the corresponding portion of the memory cell, in which no charge has been loaded in the floating gate, a voltage appearing at the floating gate $Vf$ can be calculated by the following equation.

$$Vf = \frac{Vg \cdot C_1 + VsC_3 + Vr \cdot 2C_2}{C_1 + 2C_2 + C_3}$$

Further, let it be assumed that the thickness of the first insulation layer 5 is uniform at the channel portion and the overlapping portion and that the voltages are selected to be in an erasing mode (before writing), i.e. $Vg=0V$ and $Vd=-10V; -20,$ or $-25V$. It is pointed out that since $Vr$ represents a reverse voltage applied to the drain region, the reference character $Vd$ is used instead of $Vr$ in the following discussion. Then the following values of $Vf$ and $Vox$ are obtained, in which $Vox$ is a voltage across the silicon oxide layer 4 at the overlapping portion, or $|Vd-Vf|$. In the following calculation, an example is assumed, wherein $l_2/l_1=0.04$, the first insulating layer is of $SiO_2$ ($\epsilon_r=4$) and 200A in thickness, and the second insulating layer is of $Si_3N_4$ ($\epsilon_r=8$) and 800A in thickness.

| | | | |
|---|---|---|---|
| $Vg=0$ | $Vd=-10V$ | $Vox=9.5V$ | $Vf=-0.5V$ |
| | $Vd=-20V$ | $Vox=19V$ | $Vf=-1V$ |
| | $Vd=-25V$ | $Vox=23.75V$ | $Vf=-1.25V$ |

Thus, electric fields across the first insulating layer 5 appearing between the floating gate and the source and/or drain regions are calculated as follows, assuming that the thickness of the first insulation layer of silicon oxide is 200A.

| | |
|---|---|
| $Vd=-10V$ | $Eox=4.8\times10^6$V/cm |
| $Vd=-20V$ | $Eox=9.5\times10^6$V/cm |
| $Vd=-25V$ | $Eox=1.2\times10^7$V/cm |

It is known to those skilled in the art that a Fowler-Nordheim tunnel phenomenon occurs through the silicon oxide layer, if the electric field appearing therethrough exceeds a threshold of $5\times10^6$V/cm. Thus, it is understood that the above mentioned exemplary values of voltages and thickness of insulation layer develop an electric field large enough to cause a Fowler-Nordheim tunnel phenomenon through the insulation layer.

On the other hand, electric fields appearing between the floating gate and the substrate are calculated as follows.

| | |
|---|---|
| Vd = −10V | Eox = 2.5 × 10⁵V/cm |
| Vd = −20V | Eox = 5 × 10⁵V/cm |
| Vd = −25V | Eox = 6.3 × 10⁵V/cm |

Upon consideration of the above mentioned exemplary values of the voltage and the thickness together with an experimental result, application of a voltage of $Vd = -15.5V$ while $Vg = 0V$ suffices for causing a Fowler-Nordheim tunnel phenomenon through the first insulation layer.

From the above mentioned equation for the calculation of $Vf$, it is presumed that the electric field at the overlapping portions is largely dependent on a thickness of the first insulation layer and ratio of $l2/l1$, inasmuch as the capacitance C2, C3, or C4 increases as a thickness of the insulation layer decreases, while the capacitance C2 or C4 decreases as the ratio of $l2/l1$ decreases. More specifically, when the source and drain regions are supplied with a negative voltage $Vd$ while the substrate and the control gate are grounded, assuming that no charge has been loaded in the floating gate, the voltage difference $Vfd$ across the first insulating layer at the overlapping portions between the floating gate ($Vf$) and the source and drain regions ($Vd$) is obtained as follows from the above mentioned equation.

$$Vfd = |Vf - Vd| = \frac{(C1 + C3)}{(C1 + C3) + 2C2} Vd$$

Thus, it is seen that as a ratio of $l2/l1$ is decreased, capacitance C2 is accordingly decreased and thus the voltage $Vf$ increases. Therefore, a proper selective combination of $Vg$ and $Vd$ while a ratio of $l2/l1$ is properly chosen can perform desired erasing of the inventive device.

Figure 4B:
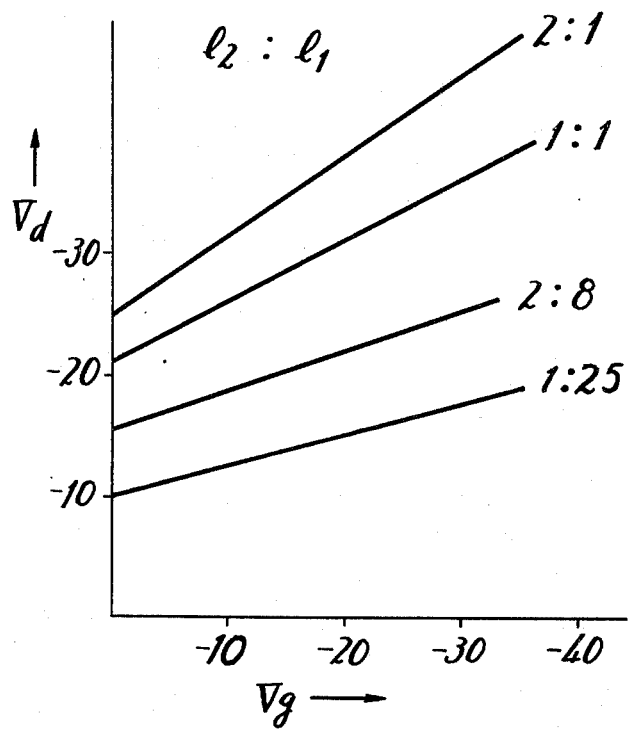

FIG. 4B is a graph showing a range for performing such erasing, in which the ordinate is Vd and the abscissa is Vg, while the ratio of $l2/l1$ is a parameter. Referring to the FIG. 4B graph, if a given voltage is applied as Vg to a memory cell having a given ratio of $l2/l1$, then the erasing operation begins when a value of Vd exceeds (in a negative direction) the value as determined in the FIG. 4B graph. From the FIG. 4B it is understood that the smaller the overlapping distance $l2$ as compared to the channel distance $l1$, assuming the same gate voltage Vg and the same thickness of the insulation layer, the smaller drain voltage Vd may be used. The smaller drain voltage makes it easy to use the memory device.

From the above mentioned discussion, it is understood that the smaller overlap distance is more preferred, although a ratio of $l2/l1$ must be larger than zero, i.e. there must be an overlap. If there is no overlap, Fowler-Nordheim tunnel conduction between the floating gate and the source and/or drain will not occur in accordance with the invention. The essential feature of the present invention is that the Fowler-Nordheim tunnel conduction is adapted to occur at the overlapping portion of the floating gate and the source and/or drain through the insulation film, with the result that a low voltage may be applied to the device for that purpose. As is well known to those skilled in the art, the source and drain regions are usually diffused through selective diffusion by the use of a mask deposited on a semiconductor substrate and having apertures for such regions. In such selective diffusion, the diffusion occurs in a transverse direction as well as in in a depth direction with respect to the apertured area. Again, as well known empirically to those skilled in the art, in such selective diffusion, the diffusion in a transverse direction is approximately 30 percent less as compared with the diffusion in the depth direction. In general, from the standpoint of practice, the lower limit of diffusion depth as controllable for the source and drain regions is $0.5\mu$ at the least. Therefore, assuming that the inventive memory device is fabricated in accordance with the inventive process as to be more fully described hereinafter, the overlap portion of a length corresponding to a transverse diffusion is obtained, so that the least possible overlap as small as $0.35\mu$ can be implemented, which is a value thirty percent less of the above mentioned lower limit depth diffusion of $0.5\mu$. On the other hand, from the graph of FIG. 4B, it is understood that the larger overlapping may be employed as a function of the voltages to be applied. Thus, from the standpoint of practical voltage value, say 30V, suitable for integrated circuits, the upper limit of the overlapping distance is two times the channel distance at the most.

Figure 5:
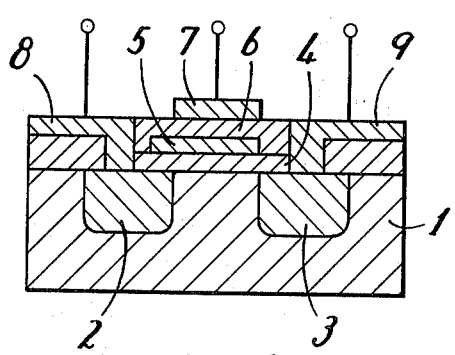
FIG. 5 is a cross sectional view of the memory device of another embodiment of the present invention.

FIG. 5 is a cross sectional view of the semiconductor memory device of another embodiment of the present invention. The floating gate 5 is constructed to have a portion overlapping only with the source region 2, and accordingly, in erasing the writing contents, all that is necessary to achieve the object is to apply the voltage of −20V only to the source region 2. The same results can also be obtained if the drain region 3 (instead of the source region 2) and the floating gate 5 are overlapped.

As is apparent from the description given above, according to the present invention, electrons are injected by the Fowler-Nordheim tunnel phenomenon into the floating gate, without causing avalanche breakdown of the PN junction, between the substrate and the source and/or drain regions. Therefore, it is not necessary that so high a voltage be used in erasing the contents, and the withstand voltage of the PN junction in the transistors of the peripheral circuit to be provided in association with the memory cells may be substantially at the same level as that of the memory cells. Accordingly, the memory cells and the peripheral circuit can be made on the same substrate in the same process, while separation therebetween need not be provided and thus any process for separation is not necessary. Furthermore, the integrating degree can be improved.

Another essential feature of the present invention is that writing of information, i.e. charging the floating gate into a positive state and erasing of the written information, i.e. injecting electrons into the floating gate can be done by the use of the same polarity voltage source. This fact facilitates integration of present memory devices.

With reference to FIGS. 6 to 17, a method of manufacturing the semiconductor memory device of the present invention will be described.

FIGS. 6 to 17 each show a cross sectional structure thereof in several steps of manufacturing the semiconductor memory device of a further embodiment of the present invention, which is similar to the device of FIG. 3, but is different in sectional shape of the gate electrode.

A first step of the present invention is that a film of the silicon dioxide of approximately 4000A thick is formed on the surface of a conductive type semiconductor substrate 10 such as N type silicon by a thermal oxidation, etc. (see FIG. 6).

A second step thereof is that the portion corresponding to the region forming a MOS transistor which constitutes one device of the semiconductor memory in the silicon dioxide film surface is removed by a selection etching so that the MOS transistor region 12 may be exposed (see FIG. 7).

A third step thereof is that an impurity layer 13 including the P type impurities or acceptors is formed on the exposed MOS transistor region 12, a conductivity type of which impurities is opposite to the conductivity type of the substrate 10 (see FIG. 8). The thickness of the impurity layer 13 is almost the same as that of the silicon oxide film 11, the layer 13 being prepared in the form of boron silicate glass including large amounts of boron which is a P type impurity by pyrolysis of silane (SiH$_4$), diborane (B$_2$H$_6$) and oxygen (O$_2$).

A fourth step thereof is that an insulating film 14 of greater thickness, or specifically the silicon dioxide film of approximately 1$\mu$ is formed on the impurity layer 13 and the silicon oxide film 11 (see FIG. 9). The silicon dioxide film formed by pyrolysis of the silane and the oxygen at approximately 430° C is suitable for the insulating film 14.

A fifth step thereof is that the insulating film 14 and the impurity layer 13 of the portion corresponding to the gate portion inside the MOS transistor region 12 is removed by the selection etching method to expose the gate portion 15 (see FIG. 10).

A sixth step thereof is that an insulating film 16 for preventing unrequired diffusion is formed on the exposed gate portion 15 obtained in, at least, the fifth step (see FIG. 11). The insulating film 16 is formed of the silicon oxide of approximately 3000A in thickness by the pyrolysis of the silane and the oxygen as in the insulating film 14 which is greater in thickness. Thus, practically the diffusion preventing insulation film 16 is formed not only on the gate portion, but also on the thick insulating film 14. The diffusion preventing insulation film 16 is so designed to prevent the unrequired or undesired impurities from being diffused from the surface area of the gate portion 15 in the forming of the source and drain regions, as will be more fully clarified below.

A seventh step thereof is that the substrate 10 which has undergone the sixth step is heated to approximately 1100° C to diffuse the P type impurities, which are contained in the impurity layer 13, into the substrate 10 contacting the impurity layer 13. Thus, the P type of source region 17 and the drain region 18 are formed (see FIG. 12). The impurity concentration of source and drain regions 17 and 18 is desired to be 10$^{19}$/cm$^3$ or more, and the diffusion depth thereof is desired to be approximately 1.5 to 2$\mu$. As a result of the diffusion process, some extent of so called lateral or transverse diffusion, as well as depth diffusion occur not only directly in the area of the substrate 10 or the region directly under and in contact with the impurity layer 13 of the substrate 10, but also in areas adjacent to the substrate or adjacent to the region directly under and in contact with the impurity layer 13. As a result, the source and drain regions 17 and 18 are formed partially extending even to the region underneath the gate region 15. The extended area or the region is approximately thirty percent less than the diffusion depth, for example, approximately 6000 to 8000A.

An eighth step thereof is that the diffusion preventing insulation film 16 formed in the sixth step is removed to expose the gate portion 15 again, and the silicon oxide layer 19, which constitutes a first insulating layer of the MOS transistor composing one device of the memory, is formed on the gate portion 15 (see FIG. 13). The thermal silicon oxide obtained by heating the substrate 10 in oxidizing atmosphere is preferable for the silicon oxide layer 19. Also, the thickness thereof is preferably approximately 200A. The thickness of 200A is a lower limit up to which the silicon dioxide layer which is good in reproducibility and is free from production of pinholes is obtained by the present semiconductor art.

A ninth step thereof is that the conductive layer 20 constituting the floating gate is formed on the silicon oxide layer 19 corresponding to a first insulating layer existing on at least the gate portion 15 (see FIG. 14). As a material constituting the conductive layer 20, theoretically any materials of high conductivity can be used, but practically, from the restrictions in manufacturing thereof, metals such as molybdenum, chromium, tungsten, zirconium, hafnium, etc. of high conductivity and of a high melting point, or metallic oxides such as titanium oxide, or semiconductors such as silicon doped in large quantities of impurities such as phosphor, boron, etc. are suitable. In a case where the molybdenum is used as a conductive layer 20, it is deposited in thickness of approximately 3000A by thermal reduction of molybdenum pentachloride (MoCl$_5$). A chemical reaction formula at this time is described for reference.

$$2MoCl_5 + 5H_2 \rightarrow 10HCl + 2Mo$$

According to the chemical reaction shown in this formula, the molybdenum is deposited on the full surface of the substrate. Therefore, it is necessary that a portion of the molybdenum is removed through an etching process so that the molybdenum remains only immediately on the required portion, namely, the gate portion 15. However, the etching process of the molybdenum does not require so high precision. In brief, the object is achieved by such a construction that the conductive layer 20 may exist on, at least, the gate portion; namely, the first insulating layer 19. As a result, the conductive layer 20 not only opposes the gate portion 15 through the first insulating layer 19, but also opposes the source and drain regions 17 and 18 formed extending to the gate portion 15.

A tenth step thereof is that a silicon nitride layer 21 serving as a second insulating layer is formed in thickness of 500 to 1000A on the conductive layer 20 obtained in at least the ninth step (see FIG. 15). What is obtained by the reaction of the silicon nitride (Si$_3$N$_4$) produced from the silane and ammonia gas (NH$_3$) with ammonium chloride (NH$_4$Cl) is used as the silicon nitride layer 21. The chemical reaction formula is as follows.

$$16NH_3 + 3SiCl_4 \rightarrow Si_3N_4 + 12NH_4Cl$$

According to the chemical reaction, the silicon nitride layer 21 is deposited on the full surface of the substrate. Therefore, as in the case of the conductive layer 20 in the ninth step, the silicon nitride layer 21 remains only on the necessary portion, and the others are etchingly removed.

An eleventh step thereof is that the insulating film 14 and the impurity layer 13, etc., which are greater in thickness, existing on the source and drain regions 17 and 18 are partially removed to expose a portion of the source and drain regions 17 and 18 (see FIG. 16).

A twelfth step thereof is that source and drain contacts 22 and 23 and a gate electrode 24 are formed of metallic materials such as aluminum etc. respectively on the exposed source and drain regions 17 and 18, and the second insulating layer 21 obtained in the tenth step (see FIG. 17). As a result of the twelfth step, a device of non-volatile semiconductor memory is completed.

The manufacturing process described hereinabove is by way of example only. For example, as shown in FIG. 18 as a first step, the impurity layer 13 is formed only in the MOS transistor region 12 directly without forming the silicon oxide film 11 at the first step (FIG. 6) described hereinabove, and thereafter the fourth step (FIG. 9) as described hereinabove is performed, whereby almost the same results are obtained.

According to the process of the present invention described above, the conductive layer 20 constituting the floating gate is adapted to overlay, with the first insulating layer 19 therebetween, the regions formed as a result of the above mentioned lateral diffusion extending from the source and drain regions 17 and 18. The electron injection into the conductive layer 20 is achieved in the erasing operation mode by the Fowler-Nordheim tunnel phenomenon through the first insulating layer 19 at the overlapping area as described fully hereinabove with reference to FIGS. 3 and 4 due to the fact that the overlapping area exists between the extended area of each source and drain areas 17 and 18, and the conductive layer 20. Therefore, preferably the thickness of the first insulating layer 19 may be approximately 200A without pinholes and with higher reproducibility. Also, the writing and erasing of the information can be performed only by one polarity of positive or negative.

As apparent from the above mentioned description, since the overlapping area between the floating gate and the source and/or drain regions through the first insulating layer is obtained by a so called lateraly diffusion in a diffusion process, the manufacturing of the overlapping area, between the floating gate and the source and/or drain regions, which requires extremely high precision can be performed very easily.

In the foregoing description the charging of the floating gate to make the characteristic of the inventive memory device more enhancement type as compared with the device as grown was referred to as "writing" and the recharging of the floating gate to return to initial condition of the device as grown was referred to as "erasing". However, in this type of memory cell, by way of another application of the cell, the charging of the floating gate is effected to make the characteristic of the inventive memory device more depletion type as compared with the device as grown for the purpose of "writing" and the recharging of the floating gate is effected to return the device to the initial condition thereof as grown for the purpose of "erasing". It is to be pointed out that the inventive memory device can be used in either of the above mentioned two types of applications.

Although the invention has been described with reference to specific example embodiments, it is to be understood, that it is intended to cover all modifications and equivalents within the scope of the appended claims.

What is claimed is:

1. A semiconductor memory device comprising a semiconductor substrate of an N conductivity type having a main surface, source and drain regions of P conductivity type spaced apart on said main surface of said semiconductor substrate, whereby PN junctions are formed between said substrate and said source and drain regions, said junctions having a breakdown point at a determinable reverse bias voltage applied therebetween, a first insulating layer formed on said main surface of said semiconductor substrate at least in an area between said source and drain regions and having a thickness from 200A to 400A, a floating metal gate electrode formed on said first insulating layer above said area on said main surface between said source and drain regions, a second insulating layer formed on said floating metal gate electrode and having a thickness from 600A to 900A, and a second gate electrode formed, opposite to said floating metal gate electrode, on said second insulating layer, said semiconductor memory device having a change in the second gate voltage versus drain current characteristic as a function of the type and quantity of electric charge applied to said floating metal gate electrode, the thickness of said first insulating layer being greater than that at which direct tunnel conduction therethrough is dominant, said first insulating layer extending above at least one of said source and drain regions and above said area on said main surface between said source and drain regions, to provide an overlapping portion of said floating metal gate electrode at least above one of said source and drain regions with said first insulating layer therebetween, said overlapping portion of said floating metal gate electrode extending a distance less than two times the distance between said source and drain regions on said main surface, first means for selectively applying in a first operation mode a voltage of negative polarity to said one of said source and drain regions with respect to said substrate and said second gate electrode, whereby a reverse bias voltage may be applied to the PN junction between said substrate and said one of said source and drain regions, said reverse bias voltage having a value lower than said breakdown voltage of said PN junction but sufficient enough to produce an electric field of less than $10^7$V/cm to permit Fowler-Nordheim tunnel conduction through said first insulating layer at said overlapping portion between said floating metal gate electrode and said one of said source and drain regions as a function of the electric field thereby applied across said first insulating layer at said overlapping portion and determined by the potential difference between the potential at said floating metal gate electrode with respect to said substrate and the potential at said one of said source and drain regions with respect to said substrate, whereby electrons move from said one of said source and drain regions into said floating metal gate electrode through said first insulating layer at said overlapping portion by Fowler-Nordheim tunnel conduction and whereby a first change in the negative direction in quantity of electric charge applied to said floating metal gate electrode results to cause a respective first change in said second gate voltage versus a drain current characteristic of said semiconductor memory device, and second means for selectively applying in a second operation mode a second voltage of the same negative polarity as that of said first voltage applying means to said second gate electrode with respect to said substrate, said second voltage having a magnitude sufficiently high to cause Fowler-Nordheim tunnel conduction through said first insulating layer above said region of said substrate on said main surface between said source and drain regions as a function of the electric field applied across the first insulating layer above said area on said main surface between said source and drain regions determined by the potential at said floating metal gate electrode with respect to said substrate and the potential at said second gate electrode with respect to said substrate, whereby electrons move from said floating metal gate electrode into said region of said substrate on said main surface between said source and drain regions through said first insulating layer above said region by Fowler-Nordheim tunnel conduction and whereby a second change in the positive direction in the quantity of electric charge applied to said first gate electrode results to cause a respective second change, in the second gate voltage versus drain current characteristic of said semiconductor memory device, said second change being in the direction opposite to said first change, the metal of said floating metal gate electrode facilitating movement of electrons from said floating metal gate electrode toward said region of said substrate on said main surface between said source and drain regions by virtue of an image force exerted between said first insulating layer and said floating metal gate electrode when said second voltage of the same negative polarity is applied to said second gate electrode with respect to said substrate.

2. The semiconductor memory device according to claim 1, wherein said floating metal gate electrode overlaps both of said source and drain regions.

3. The semiconductor memory device according to claim 1, wherein said floating metal gate electrode overlaps said source region.

4. The semiconductor memory device according to claim 1, wherein said floating metal gate electrode overlaps said drain region.

5. The semiconductor memory device according to claim 1, wherein said overlapping portion of said floating metal gate electrode and at least one of said source and drain regions with said first insulating layer therebetween has a width of $0.35\mu$ or more.

6. The semiconductor memory device according to claim 1, wherein said first insulating layer is of silicon oxide and the thickness thereof is from 200to 400A.

7. The semiconductor memory device according to claim 1, wherein said second insulating layer is of silicon nitride and the thickness thereof is from 600 to 900A.

8. The semiconductor memory device according to claim 1, in which said floating metal gate electrode is a metal selected from the group consisting of molybdenum, chromium, tungsten, zirconium, and hafnium.

9. A method for operating a semiconductor memory device comprising a semiconductor substrate of N conductivity type having a main surface, source and drain regions of P conductivity type spaced apart on said main surface of said semiconductor substrate, whereby PN junctions are formed between said substrate and said source and drain regions, said junctions having breakdown points at determinable reverse bias voltages applied therebetween, a first insulating layer having a thickness from 200 to 400A formed on said main surface of said semiconductor substrate at least in the area between said source and drain regions, a floating metal gate electrode formed on said first insulating layer above said area of said main surface between said source and drain regions and having a thickness greater than the thickness at which direct tunneling conduction therethrough is dominant, a second insulating layer having a thickness from 600 to 900A formed on said floating metal gate electrode, and a second gate electrode formed on said second insulating layer opposite said floating gate electrode, said semiconductor memory device having a change in the second gate voltage versus drain current characteristic as a function of the type and quantity of electric charge applied to said floating metal gate electrode, said first insulating layer extending above at least one of said source and drain regions from above said region on said main surface between said source and drain regions, to provide an overlapping portion of said floating metal gate electrode and at least one of said source and drain regions with said first insulating layer therebetween, said overlapping portion extending above said one of said source and drain region a distance less than two times the distance between said source and drain regions on said main surface, said memory device further comprising means for applying a voltage of negative polarity to said memory device with respect to said substrate for causing a change in at least one of the type and quantity of electric charge applied to said floating metal gate electrode and thus a change in the second gate voltage versus drain current characteristic; said method comprising the steps of connecting said voltage applying means in a first operation mode to apply a voltage of negative polarity to said one of said source and drain regions with respect to said substrate and said second gate electrode, whereby a reverse bias is applied to said PN junction between said substrate and at least one of said source and drain regions, said reverse bias voltage having an amplitude lower than the breakdown voltage of said PN junction and sufficiently high to cause an electric field of less than $10^7$ V/cm to permit Fowler-Nordheim tunnel conduction through said first insulating layer at said overlapping portion as a function of the electric field across said first insulating layer at said overlapping portion determined by the potential difference between the potential at said floating metal gate electrode with respect to said substrate and the potential at said one of said source and drain regions with respect to said substrate, whereby electrons move from said one of said source and drain regions into said floating metal gate electrode through said first insulating layer at said overlapping portion by Fowler-Nordheim tunnel conduction, and a first change in the negative direction in the quantity of electric charge applied to said floating metal gate electrodes results which in turn causes a respective first change in said second gate voltage versus a drain current characteristic of said semiconductor memory device, and then connecting said voltage applying means, in a second operation mode, to apply a second voltage of the same negative polarity as that of said first voltage applying means to said second gate electrode with respect to said substrate, said second voltage having a magnitude sufficiently high to cause Fowler-Nordheim tunnel conduction through said first insulating layer above said area of said substrate on said main surface between said source and drain regions as a function of the electric field applied across said first insulating layer above said area on said main surface between said source and drain regions determined by the potential at said floating metal gate electrode with respect to said substrate and the potential at said second gate electrode with respect to said substrate, whereby electrons are caused to move from said floating metal gate electrode into said area on said substrate through said first insulating layer above said region by Fowler-Nordheim tunnel conduction, whereby a second change in the positive direction in the quantity of electric charge applied to said floating metal gate electrode results which in turn causes a respective second change, in the second gate voltage versus drain current characteristic of said semiconductor memory device, in the direction opposite to said first change, the metal of said floating metal gate electrode facilitating movement of electrons from said floating metal gate electrode toward said area on said substrate by virtue of the image force exerted between said first insulating layer and said floating metal gate electrode when said second voltage is applied to said second gate electrode with respect to said substrate.

* * * * *